(12) United States Patent
Kent et al.

(10) Patent No.: US 7,986,544 B2
(45) Date of Patent: Jul. 26, 2011

(54) ELECTRONIC DEVICES BASED ON CURRENT INDUCED MAGNETIZATION DYNAMICS IN SINGLE MAGNETIC LAYERS

(75) Inventors: Andrew Kent, New York, NY (US); Barbaros Özyilmaz, Singapore (SG)

(73) Assignee: New York University, New York, NY (US)

( * ) Notice: Subject to any disclaimer, the term of this patent is extended or adjusted under 35 U.S.C. 154(b) by 916 days.

(21) Appl. No.: 11/935,392

(22) Filed: Nov. 5, 2007

(65) Prior Publication Data

US 2011/0038198 A1    Feb. 17, 2011

Related U.S. Application Data

(60) Provisional application No. 60/856,556, filed on Nov. 3, 2006.

(51) Int. Cl.
*G11C 11/00* (2006.01)

(52) U.S. Cl. ................. 365/148; 365/158; 365/171

(58) Field of Classification Search ........... 365/148, 365/158, 163, 171
See application file for complete search history.

(56) References Cited

U.S. PATENT DOCUMENTS

| | | | |
|---|---|---|---|
| 5,695,864 A | 12/1997 | Slonczewski | |
| 6,657,888 B1 * | 12/2003 | Doudin et al. | 365/158 |
| 7,538,338 B2 * | 5/2009 | Rinerson et al. | 257/4 |
| 7,576,956 B2 * | 8/2009 | Huai | 360/324.2 |
| 7,701,756 B2 * | 4/2010 | Aouba et al. | 365/158 |
| 2006/0050598 A1 * | 3/2006 | Rinerson et al. | 365/232 |
| 2006/0114715 A1 | 6/2006 | Bessho | |

OTHER PUBLICATIONS

J. Slonczewski, "Current-driven excitation of magnetic multilayers," Journal of Magnetism and Magnetic Materials 159, L1 (1996).

L. Berger, "Emission of spin waves by a magnetic mulitlayer traversed by a current" Phys. Rev. B 54, 9353 (1996).
M. Tsoi et al., "Excitation of a Magnetic Mulitlayer by an Electric Current" Phys. Rev. Lett. 80, 4281 (1998).
J. Z. Sun, "Current-driven magnetic switching in manganite trilayer junctions" J. Magn. Magn. Mater. 202, 157 (1999).
N. C. Emley et al., "Reduction of spin transfer by synthetic antiferromagnets" Appl. Phys. Lett., 84, 4257 (2004).
J. A. Katine et al., "Current-Driven Magnetization Reversal and Spin-Wave Excitations in Co/Cu/Co Pillars," Phys. Rev. Lett. 84, 3149 (2000).
J. Grollier et al., "Spin-polarized current induced switching in Co/Cu/Co pillars," Appl. Phys. Lett. 78, 3663 (2001).
J.-E. Wegrowe et al., "Current-induced magnetization reversal in magnetic nanowires," Europhys. Lett. 45, 626 (1999).
S. Urazhdin et al., "Current-Driven Magnetic Excitations in Permalloy-Based Multilayer Nanopillars," Phys. Rev. Lett. 91, 146803 (2003).

(Continued)

Primary Examiner — Gene N. Auduong
(74) Attorney, Agent, or Firm — Foley & Lardner LLP

(57) ABSTRACT

The present invention generally relates to magnetic devices used in memory and information processing applications, such as giant magneto-resistance (GMR) devices and tunneling magneto-resistance devices. More specifically, the present invention is directed to a single ferromagnetic layer device in which an electrical current is used to control and change magnetic configurations as well as induce high frequency magnetization dynamics. The magnetic layer includes full spin-polarized magnetic material, which may also have non-uniform magnetization. The non-uniform magnetization is achieved by varying the shape or roughness of the magnetic material. The present invention may be used in memory cells, as well as high frequency electronics, such as compact microwave sources, detectors, mixers and phase shifters.

25 Claims, 7 Drawing Sheets

OTHER PUBLICATIONS

G. Fuchs et al et al., "Spin-transfer effects in nanoscale magnetic tunnel junctions," Appl. Phys. Lett., 85, 1205 (2004).

B. Ozyilmaz et al., "Current-Induced Magnetization Reversal in High Magnetic Fields in Co/Cu/Co Nanopillars," Phys. Rev. Lett. 91, 067203 (2003).

M. Covington et al., "Current-induced magnetization dynamics in current perpendicular to the plane spin valves," Phys. Rev. B 69, 184406 (2004).

M. Yamanouchi et al., "Current-induced domain-wall switching in a ferromagnetic semiconductor structure," Nature 428, 539-542 (2004).

I. N. Krivorotov et al., "Time-Domain Measurements of Nanomagnet Dynamics Driven by Spin-Transfer Torques," Science 307, 228 (2005).

S. I. Kiselev et al., "Microwave oscillations of a nanomagnet driven by a spin-polarized current," Nature, 425, 380 (2003).

W. H. Rippard et al., "Direct-Current Induced Dynamics in Co90Fe10/Ni80Fe20 Point Contacts," Phys. Rev. Lett. 92, 027201 (2004).

Y. Ji, et al., "Current-Induced Spin-Wave Excitations in a Single Ferromagnetic Layer," Phys. Rev. Lett. 90, 106601 (2003).

B. Ozyilmaz et al., "Current-Induced Excitations in Single Cobalt Ferromagnetic Layer Nanopillars," Phys. Rev. Lett. 93, 176604 (2004).

M. L. Polianski and P. W. Brouwer, "Current-Induced Transverse Spin-Wave Instability in a Thin Nanomagnet," Phys. Rev. Lett. 92, 26602 (2004).

M. D. Stiles, J. Xiao and A. Zangwill, "Phenomenological theory of current-induced magnetization precession," Phys. Rev. B 69, 054408 (2004).

B. Ozyilmaz et al., "Bipolar high-field excitations in Co/Cu/Co nanopillars," Phys. Rev. B 71,140403(R) (2005).

A. Brataas, Y. Tserkovnyak and G. E. W. Bauer, "Current-induced macrospin vs. spin-wave excitations in spin valve," scond-mat/0501672 (2005).

Kyung-Jin Lee et al., "Excitations of incoherent spin-waves due to spin-transfer torque," Nature Materials 3, 877-881 (2004).

B. Ozyilmaz, "Spin Transfer in Magnetic Nanopillar Junctions," Ph.D. Thesis, New York University (2005).

S. Adam, M. L. Polianski and P. W. Brouwer, "Current induced transverse spin-wave instability in thin ferromagnets: beyond linear stability analysis," cond-mat/0508732 (2005).

T. Y. Chen et al., "Enhanced Magnetoresistance Induced by Spin Transfer Torque in Granular Films with a Magnetic Field," PRL 96, 207203 (2006).

S. I. Kiselev et al., "Spin-transfer excitations of permalloy nanopillars for large applied currents," Physical Review B 72, 064430 (2005).

V. S. Pribiag et al., "Magnetic vortex oscillator driven by d.c. spin-polarized current," Nature Physics 3, 498 (2007).

S. Kaka et al., "Mutual phase-locking of microwave spin torque nano-oscillators,"Nature (London), 437, 389 (2005).

F. B. Mancoff et al., "Phase-locking in double-point-contact spin-transfer devices," Nature (London) 437, 393 (2005).

M. R. Pufall, et al., "Electrical Measurement of Spin-Wave Interactions of Proximate Spin Transfer Nanooscillators," Phys. Rev. Lett. 97, 087206 (2006).

B. Ozyilmaz, et al., "Current-induced switching in single ferromagenetic layer nanopillar junctions," Applied Physics Letters 88, 162506 (2006).

\* cited by examiner

Figure 5A
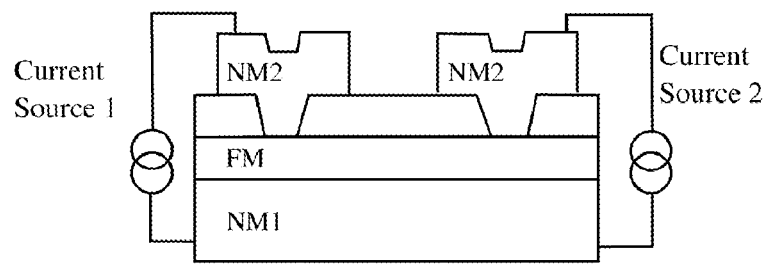
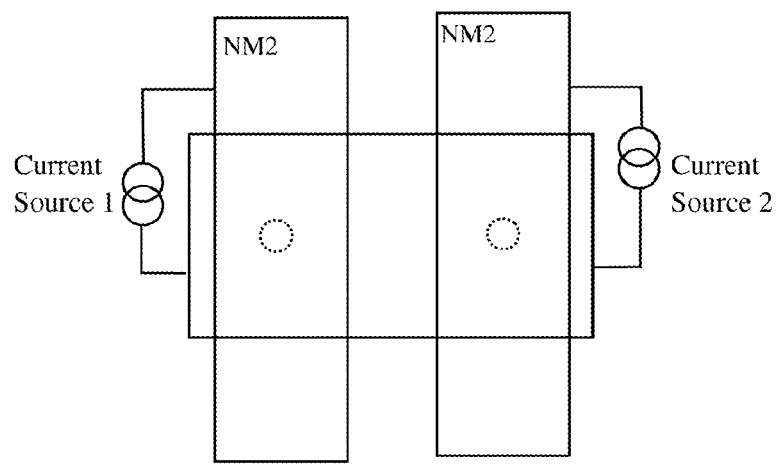
Figure 5B
Figure 6
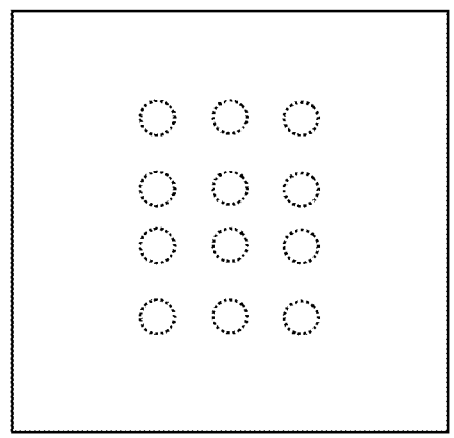

ELECTRONIC DEVICES BASED ON CURRENT INDUCED MAGNETIZATION DYNAMICS IN SINGLE MAGNETIC LAYERS

This application claims the priority under 35 U.S.C. §120 of U.S. Provisional Application No. 60/856,556 filed on Nov. 3, 2006, which is incorporated herein by reference in its entirety.

This invention was made with government support under Contract Nos. NSF-DMR-0405620 and NSF-DMR-0706322. The U.S. Government has a paid-up license in this invention and the right in limited circumstances to require the patent owner to license others on reasonable terms as provided for by the terms of Grant Nos. NSF-DMR-0405620 and NSF-DMR-0706322 awarded by the National Science Foundation.

FIELD OF THE INVENTION

The present invention generally relates to magnetic devices used in memory and information processing applications, such as giant magneto-resistance (GMR) devices and tunneling magneto-resistance devices. More specifically, the present invention describes a device that requires only one ferromagnetic layer.

BACKGROUND OF THE INVENTION

Devices using spin-momentum transfer, such as those described in U.S. Pat. No. 5,695,864 (Slonczewski) and J. Slonczewski, Journal of Magnetism and Magnetic Materials 159, L1 (1996), consist of at least two ferromagnetic regions, which play distinct roles. One of these regions is designed to have its magnetization fixed or pinned while the other region has a changeable magnetization direction. The fixed magnetization region serves two functions: it both provides a spin polarized current and it serves as a reference layer to detect changes in the magnetization of the second region. The changes in magnetization direction of the second region lead to changes in device resistance, which can be detected electrically. The origin of this change in resistance is giant magneto-resistance or tunnel magnetoresistance. For MRAM applications one of the key challenges is to reduce the current and power needed change the magnetization state and induce magnetization precession. A further challenge is to have a significant change in resistance so as to have a large device output signal. Thus methods, operating principles and materials are sought which enable device operations at lower currents and large device output signal.

In 1996, a new mechanism was proposed by which the magnetization of a small ferromagnetic element may be manipulated when the latter is traversed by a spin polarized charge current. This concept, known as spin transfer, relies on the local interaction between a spin polarized current and the background magnetization of a ferromagnet. Spin transfer induced magnetization dynamics has been recently demonstrated experimentally in a wide variety of the material systems and is rapidly reaching device maturity. Furthermore, direct measurements of the magnetization dynamics have shed light on the fundamental mechanism of spin transfer.

With a few exceptions, most spin transfer devices consist of at least two exchange decoupled ferromagnetic regions, which play distinct roles. One of these regions is designed such that it simultaneously provides both a spin polarized current and a reference layer relative to which the manipulation of the second ferromagnetic region is detected. However, recently it has been demonstrated that such a distinction between a "fixed layer" and a "free layer" is not necessary. In large magnetic fields applied perpendicular to the thin film plane, current induced reversible changes in junction resistance have been observed in pillar junctions having only a single ferromagnetic layer. These excitations have been associated with the onset of non-uniform spin wave modes. The spin transfer mechanism relies on a feedback mechanism between the single layer magnetization and the spin accumulation in the adjacent nonmagnetic layers.

In magnetic fields below the demagnetization field, spin transfer may lead to both reversible excitations and hysteretic changes in the junction resistance. Systematic, abrupt and hysteretic changes in device resistance have been observed in sub-100 nm size pillar junctions containing a single ferromagnetic (FM) layer in small perpendicular magnetic fields ($H<H_{demag}$). Both the threshold currents and the current induced hysteresis in these junctions exhibit a well defined magnetic field dependence. Similar to the high field excitations, the low field single layer switching events lead to a low resistance state. However, the threshold currents and the corresponding changes in device resistance in the two regimes are very distinct. Remarkably, in the low field regime the magnetoresistance is comparable to that observed in the more traditional bilayer geometry. Recent micromagnetic studies discuss considerable inhomogeneities of the free layer magnetization during magnetization reversal in bilayer junctions.

SUMMARY OF THE INVENTION

The present invention relates to current induced magnetization switching and current induced changes in magnetic domain configurations in nanostructured ferromagnets. It also relates to magnetization dynamics induced by a current in nanostructured ferromagnets. The nanostructured ferromagnet may include without limitation a nanopillar, i.e., two or more stacked layers having electrical contact to the top and bottom of the stack, and a lateral dimension generally less than a few hundred nm. The single magnetic layer is preferably placed asymmetrically in the pillar but may be symmetric or asymmetric. The single magnetic layer may be without limitation Cu/Co/Cu or may be other various combinations of magnetic and non-magnetic elements. The current induced magnetization dynamics may take place at various temperatures including without limitation ambient or room temperatures.

The present invention provides an alternative structure and operating principle for magnetic memory or magnetic information processing devices. The invention may optionally achieve a reduction in current or power consumption by using ferromagnetic materials that are fully spin polarized as opposed to materials which have only partial spin polarization. Devices which are constructed in accordance with the present invention may also function as oscillators, spin transfer torque driven microwave sources, detectors, phase shifters, and mixers.

According to a first aspect of the present invention, methods and devices for current induced single layer switching (CISS) are provided. According to a second aspect of the present invention, devices exhibiting current induced non-uniform spin wave excitations are provided. The former type of devices provide the ability to store and access information. The latter type of devices allow the fabrication of microwave sources, oscillators, mixers and phase shifters.

One of the operating principles of the devices of the present invention is based on non-uniform magnetization configurations of the single layer ferromagnet. Another principle is based on asymmetry in the spin accumulation in the pillar junction with respect to the position to the ferromagnetic layer.

BRIEF DESCRIPTION OF THE DRAWINGS

The foregoing and other features of the present invention will be more readily apparent from the following detailed description and drawings of the illustrative embodiments of the invention wherein like reference numbers refer to similar elements throughout the views and in which:

FIGS. 4a-b are illustrations of a nanocontact to a magnetic thin film, with FIG. 4a showing a cross-section of the device indicating a nonmagnetic layer (NM1 and NM2) a single ferromagnetic layer (FM) and an insulating layer (I), with the opening in the latter defining the contact region, while FIG. 4b shows a top view of the device;

FIGS. 5a-b are illustrations of two nanocontacts to a magnetic thin film, with FIG. 5a showing a cross-section of the two contacts and FIG. 5b showing a top view;

FIG. 6 is an illustration of a top view of an array of nanocontacts to a magnetic thin film;

DETAILED DESCRIPTION OF THE INVENTION

Figure 1:
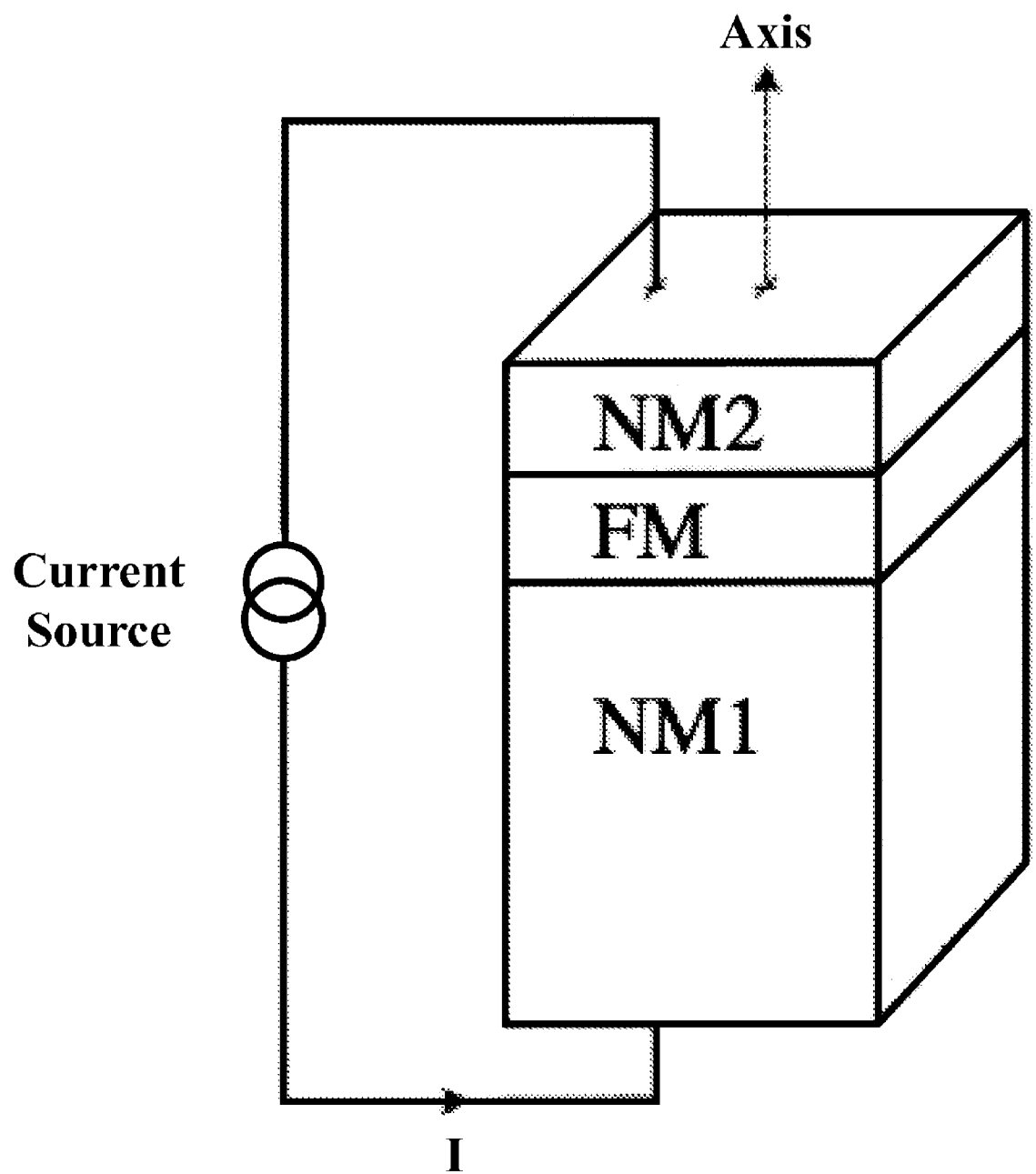
FIG. 1 is an illustration of a magnetic device according to an embodiment of the present invention.

Non-uniform magnetization can be achieved in accordance with the present invention in a number of different ways. The magnetization state of a thin magnetic layer is typically non-uniform to reduce the magnetostatic energy of the layer. The degree of non-uniformity depends on many factors. One way to create a non-uniform configuration is through the shape of the magnetic element. For example, a thin disc may lead to a vortex state in which the magnetization circulates around the center of the disk; a rectangular or elliptical shape will have a magnetization that is aligned with the long axis of the rectangle or ellipse, but at the ends will deviate—there are at least two possible deviations, i.e., where the magnetization at the ends point in the same direction or in opposite directions. A second approach may be the growth of ferromagnetic layers on surfaces, which have an intrinsic roughness either due to the presence of roughness in an underlying layer or due to presence of grains in the underlying polycrystalline thin film metallic layers. A third approach is the lithographic introduction of controlled roughness into the layers of the pillar junction by patterning shallow steps into the bottom electrode prior to the growth of the pillar junction. Furthermore an artificial roughness of the edges of the pillar junction may be beneficial in introducing a non-uniform magnetization at the edges. A fourth approach is to replace the homogenous ferromagnet with a granular solid, in which nanometer size magnetic entities such as Co are embedded in a normal metal medium such as Cu or Ag. Such films can be grown with cosputtering of Co and Ag and have been shown to exhibit spin transfer induced resistance changes of up to 400%. The large resistance values at zero field are due to the random orientation of the magnetic moments and thus may provide an intrinsic non-uniformity of the magnetization for single layer spin transfer torque operation. There are a variety of magnetic/non-magnetic material contributions from which granular solids can be formed, including Co/Cu, Co/Au and Co/Cr.

One factor in device operation is an asymmetry in spin accumulation. This can be achieved by choosing a thin film stack with different spin diffusion lengths on either side of the ferromagnetic layer. An exemplary stack sequence is |10 nm Pt|10 nm Cu|Co|300 nm Cu|. This is sometimes referred to as an asymmetric pillar junction, since the Co layer is located much closer to the Pt layer. The stack sequence may be fabricated using various known methods. One such exemplary method is the use of a nano-stencil mask process (see FIG. 2c inset). Junctions may have varying layer thickness. Such variation may preferably range from 0.3 nm to 60 nm. Such variation may be less than 0.3 nm or greater than 17 nm as well. The thickness of the Co layer is generally in the range of 0.3 to about 60 nm. The minimum thickness is one atomic layer, and the maximum thickness is preferably greater than the spin diffusion length of the material. For Co, this is around 60 nm. For $Ni_{1-x}Fe_x$ (permalloy, with x=0.8) this is 4 nm.

An alternative layer sequence is to place the ferromagnetic layer directly on-top of the Pt layer, which increases the spin accumulation asymmetry. Also, the pillar junction may be placed on-top of an inert base electrode such as graphene or graphite. The latter may provide a layer with very long spin diffusion length. The asymmetry in spin accumulation can be achieved by placing a Pt layer above the ferromagnetic layer, such that the stack sequence is as follows: Graphene, Graphite/FM/Pt.

The lateral dimensions of the stack may vary. In one embodiment, such lateral dimensions may preferably range from 30 nm×60 nm up to 70 nm×210 nm. Such later dimensions of the stack may be greater or smaller than these dimensions as well.

An example of an asymmetric pillar junctions ~50 nm in size with a stack sequence of |10 nm Pt|10 nm Cu|Co|300 nm Cu| is illustrated in the inset of FIG. 1. As discussed above, the thickness of the Co layer is generally in the range of 0.3 to about 60 nm. Many junctions with a Co layer thickness varying from 2 nm to 17 nm and lateral dimensions from 30 nm×60 nm up to 70 nm×210 nm have been studied as a function of bias current and applied field. All junctions in this thickness range at magnetic fields $H<4\pi M_s$ applied perpendicular to the thin film plane exhibit current induced hysteretic changes in the device resistance. Representative data obtained on pillar junctions with ~15 nm thickness and lateral dimensions of 30 nm×60 nm is discussed in some of the present examples described and illustrated herein. Experiments were conducted at room temperature in a four point-geometry configuration with fields applied perpendicular to the thin film plane. The differential resistance dV/dI was measured by a lock-in technique with a 100 µA modulation current at f=873 Hz added to a dc bias current. Positive current is defined such that the electrons flow from the bottom electrode of the junction to the top electrode.

Figure 2A:
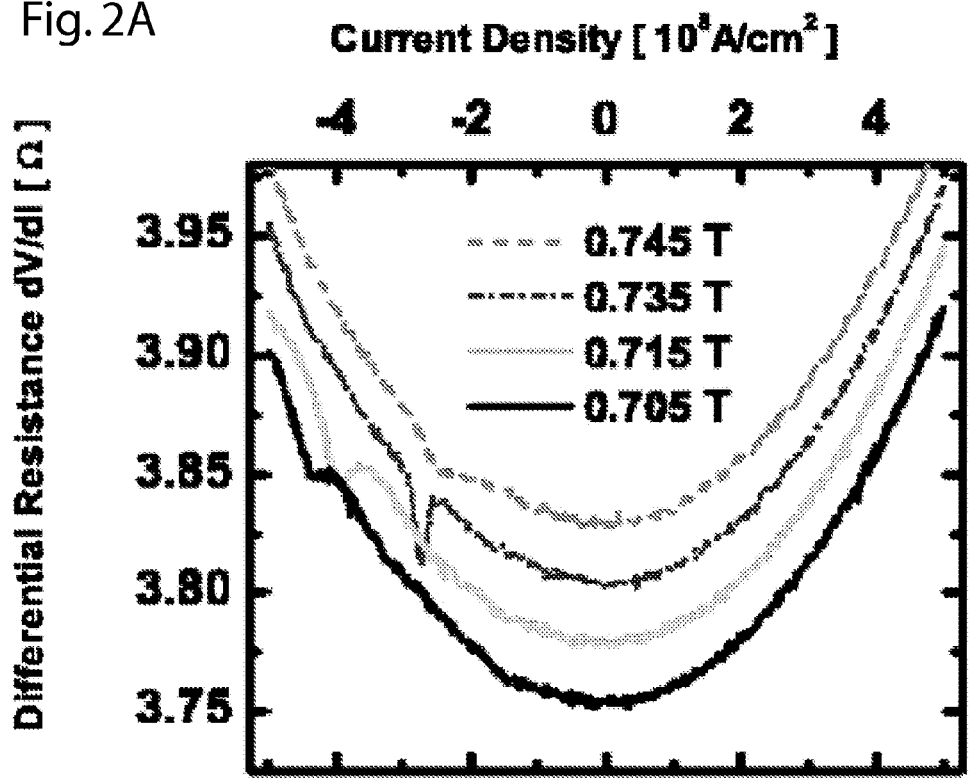
FIGS. 2a-c illustrate measurements of the electrical characteristics of a single magnetic layer device, with FIGS. 2a and 2b showing reversible changes in device resistance in response a current, and FIG. 2c showing single layer hysteretic switching.
Figure 2B:
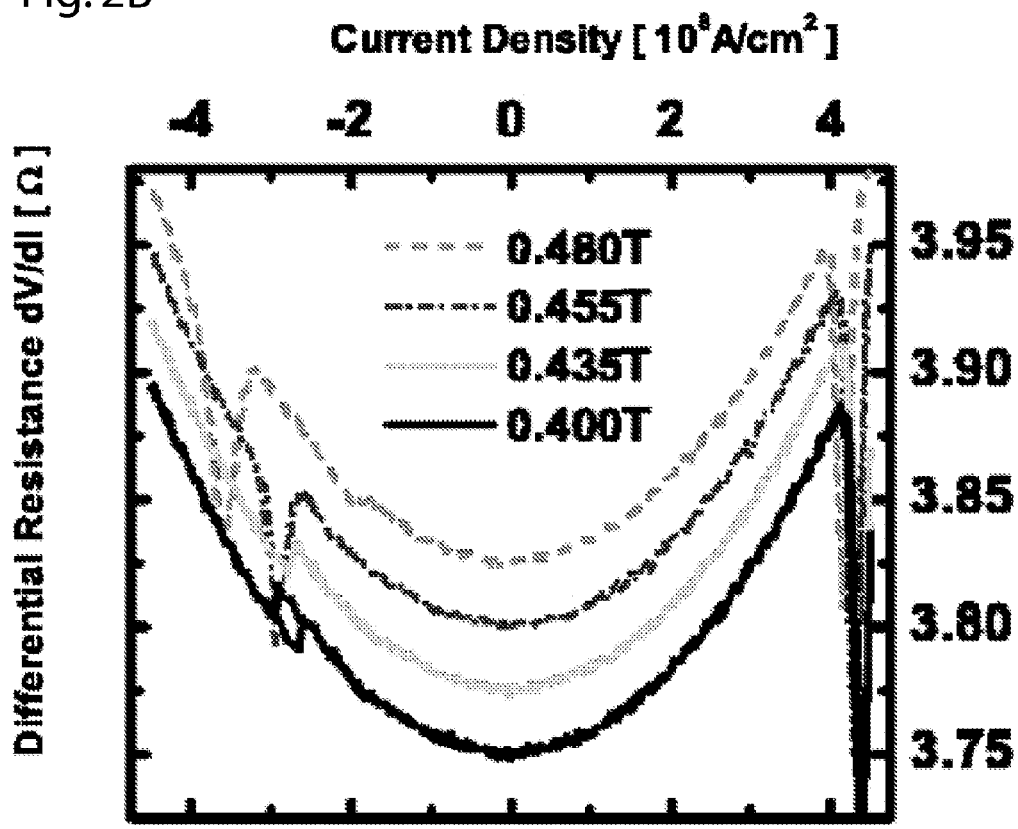
Figure 2C:
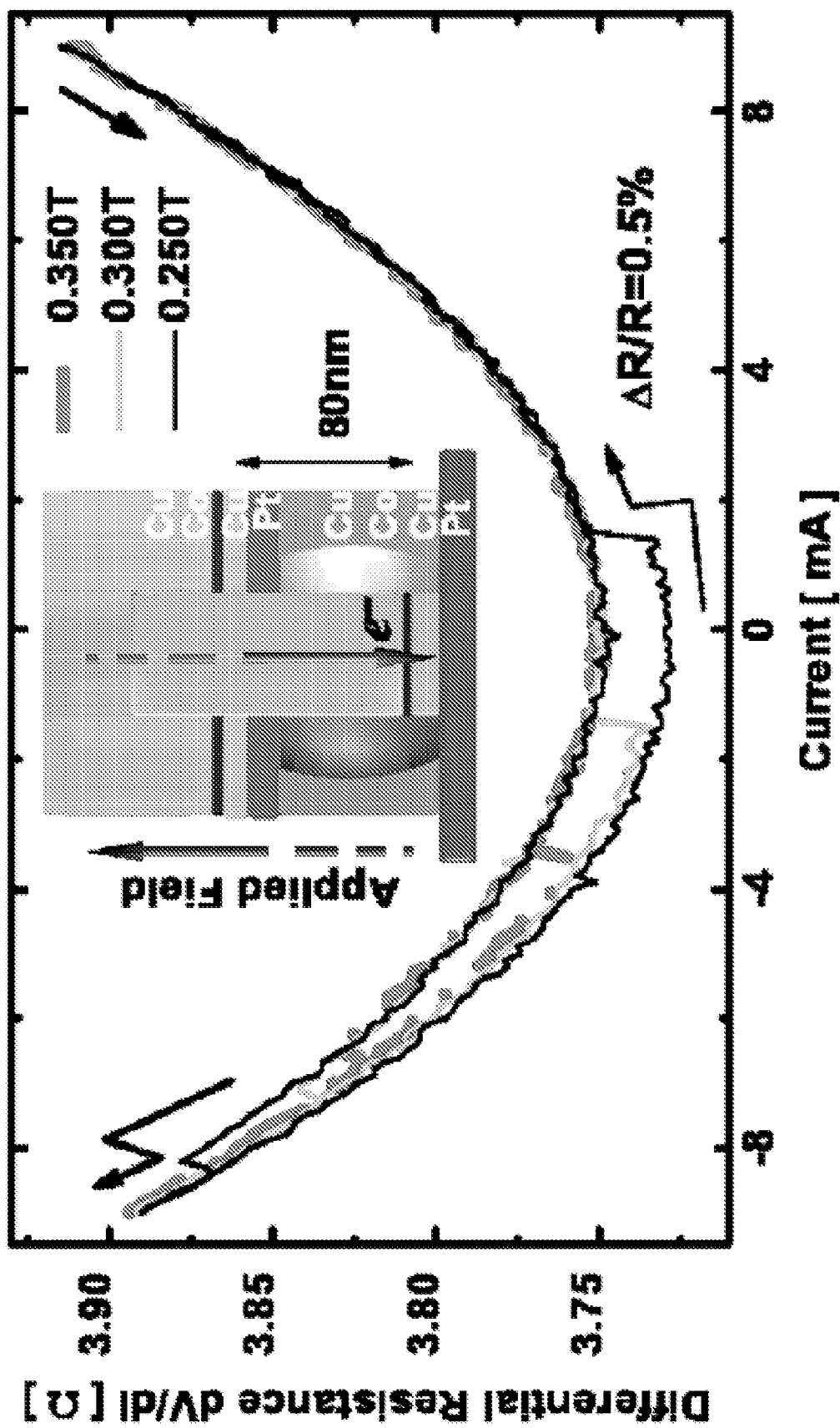

Characteristic current sweep traces for selected field values are shown in FIGS. 2a-c. At high fields reversible dips in dV/dI are only observed at negative currents. (FIG. 2a) At intermediate field values dips in dV/dI are observed for both current polarities. (FIG. 2b) At low magnetic fields current sweeps exhibit hysteretic behavior. Inset shows current polarity convention. (FIG. 2c) Unipolar reversible dips similar to ones seen in large applied fields (H>>4πM$_s$) are observed in fields down to H<0.6 T. In smaller fields, reversible dips are observed for both current polarities. There is a dramatic change in the current sweep traces when the magnetic fields are lowered further. At fields below H<0.5 T hysteretic and abrupt changes in the junction resistance are observed. Starting from a current of +9 mA the junction remains in a high resistance state until I≈−8 mA, where it switches to a resistance state that has a 0.5% smaller resistance. The junction remains in the low resistance state until the current sweep direction is reversed and reaches +1.5 mA. At this latter current value, the junction switches back to a high resistance state. In both the switching from a low resistance state to a high resistance state and vice versa, the junction resistance changes by ~0.5%. Comparing this resistance change with the anisotropic magnetoresistance (AMR) at zero dc bias of similar junctions, the latter was measured in such junctions at a temperature of 4.2 K and was found to be ~0.1%. The current induced hysteretic resistance change at low magnetic fields and room temperature is a factor of 5 larger and thus is not associated with the AMR effect.

The applied field dependence of current induced single layer switching (CISS) may be summarized by plotting the differential resistance dV/dI during the current sweep up (FIG. 2(a)) and current sweep down (FIG. 2(b)). To clearly distinguish CISS from the varying background resistance, the differential resistance minus a polynomial fit is plotted. That is, a smooth curve has been subtracted from the measured differential resistance to clearly show the current at which there are abrupt changes in device resistance. Here, the current is swept from +9 mA to −9 mA and back to +9 mA while the magnetic field is held constant. In subsequent current sweeps the applied field is reduced to zero from 0.9 T in steps of 5 mT. From FIGS. 2a-c, it is observed that the critical currents necessary to switch the junction resistance to a low resistance state shift to more negative currents with decreasing applied fields such that below 0.21 T the junction resistance remains in the high resistance state. On the other hand, the width of the current induced hysteresis increases with decreasing applied field and at 0.21 T it reaches approximately 10 mA.

Even in single layer junctions the fundamental mechanism for current induced excitations remains spin transfer. Here, fluctuations of the magnetization in conjunction with the diffusive transport at the normal metal-ferromagnet interfaces are believed to cause a locally transverse spin accumulation and hence generate spin transfer torques. In fields H<4πM$_s$ non-uniformities in the magnetization could provide directly for a local transverse spin accumulation along the interface. It should be noted that systematic current induced switching events are absent in the field in-plane configuration. Thus, one explanation for the non-uniformity of the magnetization in terms of the granular structure of the ferromagnetic layer can be excluded. Furthermore, the absence of systematic current induced switching events in the in-plane geometry provide evidence that the observed hysteresis is not caused by the presence of an extended ferromagnetic layer within the top electrode. This layer has a minimal impact both because it is separated from the nanomagnetic (see FIG. 1, inset) and because there is an intervening Pt layer, which is a strong spin scatter. In fact, the MR observed in in-plane field sweeps at zero dc bias is an order of magnitude smaller than the current induced MR.

One possible magnetic configuration which could provide for both a bistable state in the field perpendicular geometry and a distinct dependence on the applied field direction is a vortex state. In a perpendicular field below the demagnetization field, a change of the applied field, leads to a change of the angle between the neighboring magnetic moments of the disk magnetization and between the disc magnetization and the applied field itself. Thus, it seems reasonable to assume that here the spin transfer torques show a strong magnetic field dependence. Evidently transport measurements are not well suited for deducing the nature of the two magnetic states. However, the large decrease/change in junction resistance does provide evidence that the two resistance states correspond to markedly distinct magnetic configurations. Recently, it has been argued that a non-uniform magnetization can lower the junction resistance. In contrast to a uniform magnetization, a non-uniform magnetization provides a mechanism for the mixing of the spin channels and thus decreases the net spin accumulation across the pillar junction. Again, a vortex state would be a good candidate for the low resistance state. An ideal candidate for a high resistance state would be a single domain ferromagnetic layer. Thus one possible scenario for the observed hysteretic change in junction resistance could be a current induced change of the layer magnetization from a vortex state to a state of near uniform magnetization.

This demonstrates that for an "intrinsic" non-uniform magnetization distribution in sub-100 nm junctions within single ferromagnet layer pillar junctions, even at low current bias, feedback effects between the layer magnetization and the spin accumulation in the adjacent nonmagnetic layers may have to be taken into account to fully understand spin transfer. These results show that the magnetoresistance effect in a single layer junction associated with a change in spin accumulation may provide an alternative way to read out the magnetic state of a pillar junction.

Magnetic fields may be applied at various orientations relative to the thin film plane. A possible orientation is a magnetic field applied perpendicular to the thin film plane. Various magnetic fields may be used. Some magnetic fields (H) may be such that H<4πM$_s$.

The present invention may employ materials that can become partially spin polarized and/or materials that can become fully spin polarized and/or materials with half metallic properties. Half metals and fully spin-polarized materials describe the same type of materials. These terms generally describe materials in which the electrons at the Fermi energy level are of only one spin type, either all 'up' or 'down' relative to the direction of magnetization. The electrons at the Fermi energy level are the conduction electrons and carry current. Therefore, the currents in such materials are fully spin-polarized. Typically, transition metal ferromagnets such as Fe, Ni and Co, and alloys of these elements are only partially spin-polarized, i.e., there are both up and down electrons at the Fermi energy level which conduct the current.

The maximum obtainable magnetoresistance value in a device having a single ferromagnetic layer may strongly depend on the degree to which the ferromagnetic element conduction electrons are spin polarized. This is similar to conventional magnetoelectronic devices based on the giant magnetoresistance or tunnel magnetoresistance effect in which the maximum obtainable magnetoresistance value is proportional to the degree of spin polarization of the ferromagnetic layer(s). In the case of a highly or fully spin polarized ferromagnetic layer, magnetoresistance values may be substantial. These values may be approximately 50% as well as less than 50% or more than 50%. Also, a highly or fully spin polarized layer may substantially reduce the critical currents required to induce magnetization reversal, further improving device performance. Potential materials for such a layer include without limitation $Fe_3O_4$, $CrO_2$, Manganite materials (including without limitation $LaCaMnO_3$, $La_{1-x}Ca_xMnO_3$, $La_{0.7}Ca_{0.3}MnO_3$), LSMO materials (including without limitation $La_{1-x}Sr_xMnO_3$, $La_{0.7}Sr_{0.3}MnO_3$) and Heusler alloys.

The single layer magnetoresistance effect relies on the fact that a magnetic layer acts as a spin-filter. This means that a current that is initially unpolarized becomes polarized on passing through the layer. The degree of polarization depends on the material. If the ferromagnetic layer is fully spin-polarized (also called a half-metallic material) the current becomes fully spin polarized. In this process only half of the electrons pass through the layer, those with the "right" polarization are filtered (or reflected) from the ferromagnetic layer. As with any filtering, the process which leads to the selective transmission provides a resistance in the current path. Here, that resistance results in a higher junction resistance.

When domains form in the thin layer or the magnetization in the thin layer is otherwise non-uniform, the filtering is less effective. In a simple view that illustrates the basic device operation, the single layer may be viewed as having two domains, one magnetized up, the other magnetized down. Then, electrons reflected from one region of the layer can be transmitted through another part of the layer. In the best case there can be full transmission, giving the 50% magnetoresistance effect. Since now the filtering is less effective, the resistance of the junction decreases. This operating principle described above is similar to the Giant-Magnetoresistance effect, but occurs in a structure with only a single magnetic layer.

A current is used to change the magnetic configuration of the device, i.e., it is used to write information. The associated change in device resistance is measured and is, in effect, used to read out the information stored in the device. A current pulse may be applied to change the magnetic configuration, i.e., to selectively write information. The pulse may have a predetermined shape and length. It may have positive and negative going portions or may have just one polarity of current. The resistance may be measured with a current source and a voltmeter, or using a lock-in amplifier technique.

The current required to change the magnetization configuration can be reduced by substituting a transition metal ferromagnet layer with a low magnetization density ferromagnet or dilute ferromagnetic semiconductor layer. The effects that lead to a reduction of critical currents are two-fold. First, by having replaced the ferromagnet with a lower magnetization density ferromagnetic material, the critical currents are reduced due to the reduction of total angular momentum that must be changed. Second, in dilute ferromagnetic semiconductors, such as Mn-doped GaAs, charge carriers mediate the magnetic coupling. Therefore, it is likely that the currents will alter the coupling and may lead to non-uniform magnetization and reduced critical currents. Lower magnetization density ferromagnets can be formed by alloying magnetic and non-magnetic elements, such as the transition metals Ni and Fe and alloyed with Ti, V, Cr, Mn or Cu, such as FeV or NiCu or NiFe/Cu.

Naturally, a magnetoelectronic device based on two fully spin polarized magnetic layers could in principle obtain even larger magnetoresistance values. However, it is important to keep in mind that such materials in most cases require a specific seed layer and/or substrates and rather specific growth conditions and environments, such as provided in molecular beam epitaxy or chemical vapor deposition. Such conditions may be difficult to realize at both the free and fixed layer interfaces and perhaps even incompatible with the requirements for the intervening spacer layer.

In the present invention, a single ferromagnetic layer is sufficient. Therefore, the challenge associated with highly or fully spin polarized materials and/or materials with half metallic properties in terms of both growth condition and seed layer preparation may be less stringent. Hence, the use in the present invention of single layer magnetization reversal may provide a more cost effective approach in incorporating highly or fully spin polarized materials and/or materials with half metallic properties into magnetoelectronic devices.

Figure 3:
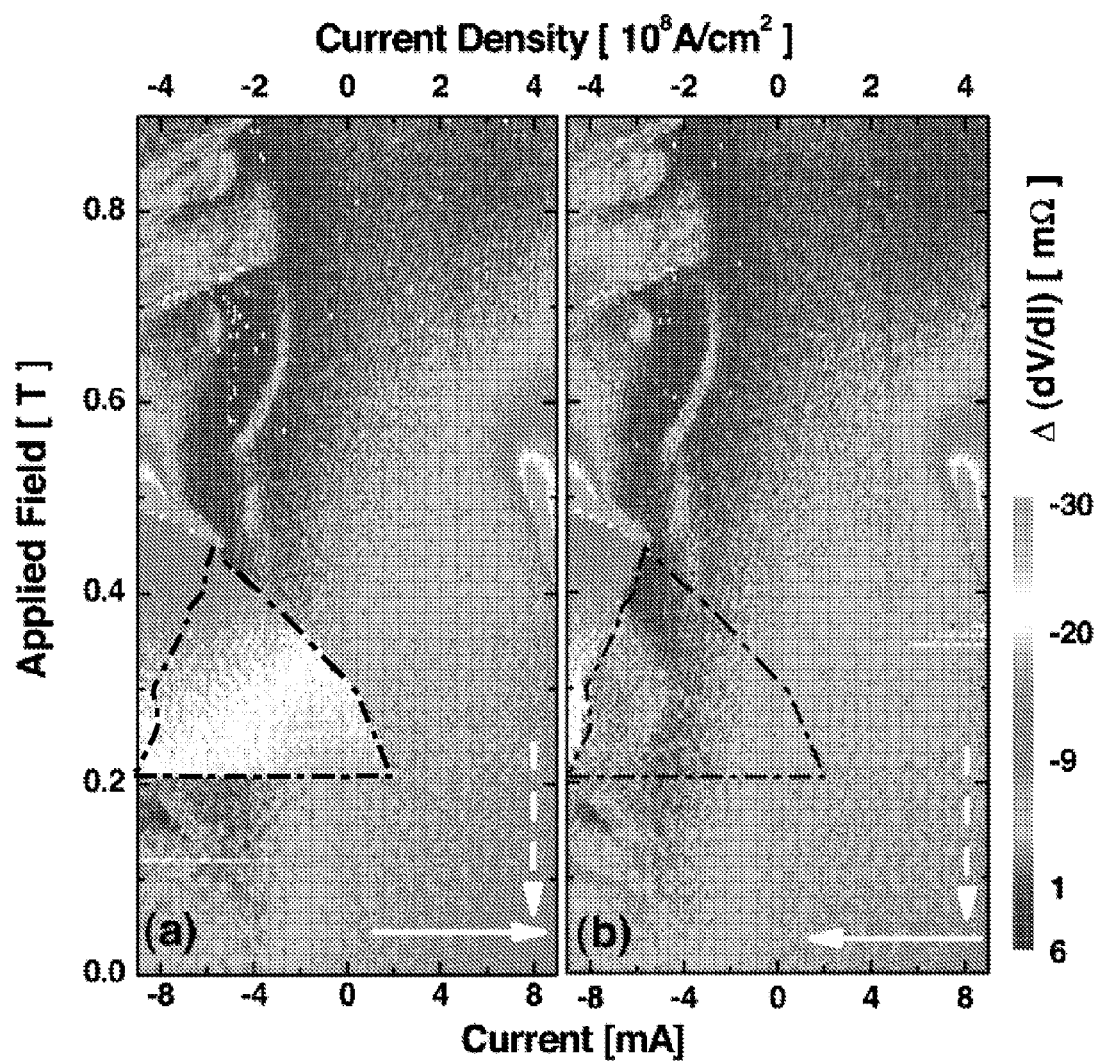
FIG. 3 is an illustration of device resistance on a gray scale as a function of the current density and the applied magnetic field, with the hatched regime in the left hand graph enclosing the range of parameters (field and current) in which two resistance states of the device are observed.

Referring now to FIG. 3, therein is illustrated a low field phase diagram for current induced excitations in single layer pillar junctions. The differential resistance minus a smooth curve, which is a polynomial function of the current, is plotted on a gray scale as a function of both applied field and current bias. The darker region indicates low differential resistance. The lighter region indicates high differential resistance. White solid arrows indicate current sweep direction and dashed arrows indicate field step direction: (a) Current sweep up; (b) Current sweep down. The data in FIGS. 3(a) and 3(b) match well except for the region enclosed by the black dashed dotted line. In the range of current and magnitude field enclosed by the black dashed dotted line, the device has two possible resistance states corresponding to at least two different magnetic states of the single layer. This is a characteristic of a device that stores information.

Alternatively, the critical currents can be reduced further by substituting the metal ferromagnetic layer with a semiconducting dilute ferromagnetic layer. The effects which lead to the reduction of critical currents are two-fold. First, by having replaced the ferromagnet with a dilute ferromagnet, the critical currents are reduced due to the reduction of total magnetic moments to be switched. Second, in dilute ferromagnetic semiconductors such as $Mn^{2+}$-doped GaAs requires charge carriers to mediate the magnetic coupling. Therefore, it is likely that the single layer magnetization deviates strongly from non-uniformity and thus reduces critical currents.

Single Layer Spin Transfer Torque Oscillator

In certain ranges of current and applied magnetic field a single layer exhibits well defined excitations which may decrease the junction resistance. Such excitations have been recently identified in more traditional devices as non-uniform excitations in the thicker ferromagnetic layer of a standard FM/NM/FM system. Here, the spin-transfer torques results in the reorientation of the local magnetic moments in the sample. When the applied fields and currents are within certain ranges, the reorientation of the magnetic moments takes place in a dynamic and oscillatory fashion, which reflects itself in an oscillatory change in sample resistance as a function of time on microwave frequency scales, from about 100 MHz to about 200 GHz. These excitations occur above a threshold current density, which is typically in the range of $10^5$ $A/cm^2$ to about $10^8$ $A/cm^2$. It is desirable to reduce the threshold current as much as possible to reduce the device power consumption. Reducing the thickness of the magnetic layer reduces the current density required. The range of fields at which these excitation occur ranges from zero field (no applied field) to several tesla. The frequency of the oscillation will depend on the applied current and the magnetic field, as well as the device materials and structure. Since the samples are biased with a dc current, these resistance changes generate voltage signals which in turn are also oscillatory in the microwave frequency range. Thus, the current induced magnetization dynamics may be utilized by frequency-domain measurements of microwave signals and thus, may provide microwave sources, detectors, mixers and phase shifters that are highly compact and operate at a high frequency.

The microwave oscillations produced by the thick-layer dynamics in typical devices with two magnetic layers, a thick and a thin layer, have been associated with non-uniform excitations. These excitations can result in a frequency that is much better defined than for the nearly uniform modes. Non-uniform modes can have high quality factors with $f/\Delta f \geqq 1000$, where $\Delta f$ is the full width at half maximum (FWHM) of the signal at frequency f. In addition, these resistance oscillations produce larger microwave signals than the uniform modes. Therefore, the microwave signals originating from the non-uniform modes may be useful in high frequency applications.

Figure 4A:
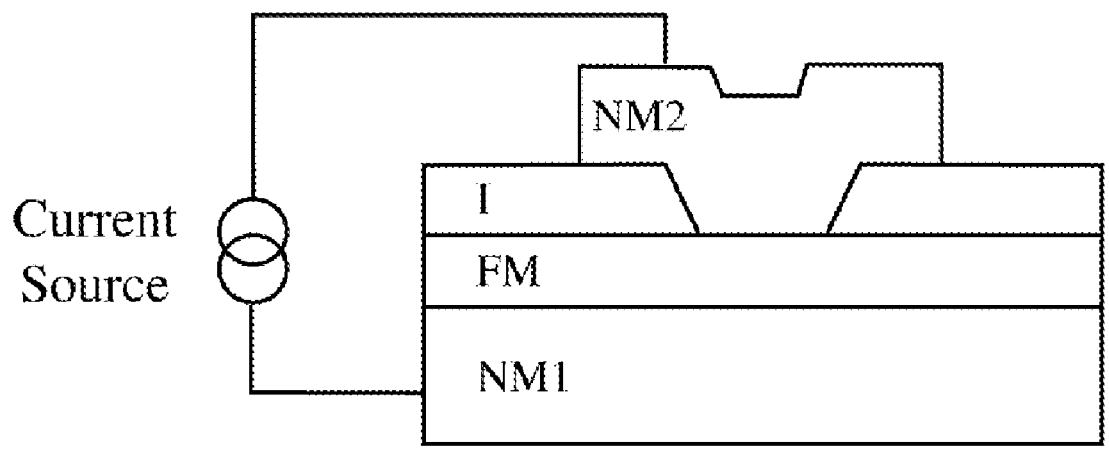
Figure 4B:
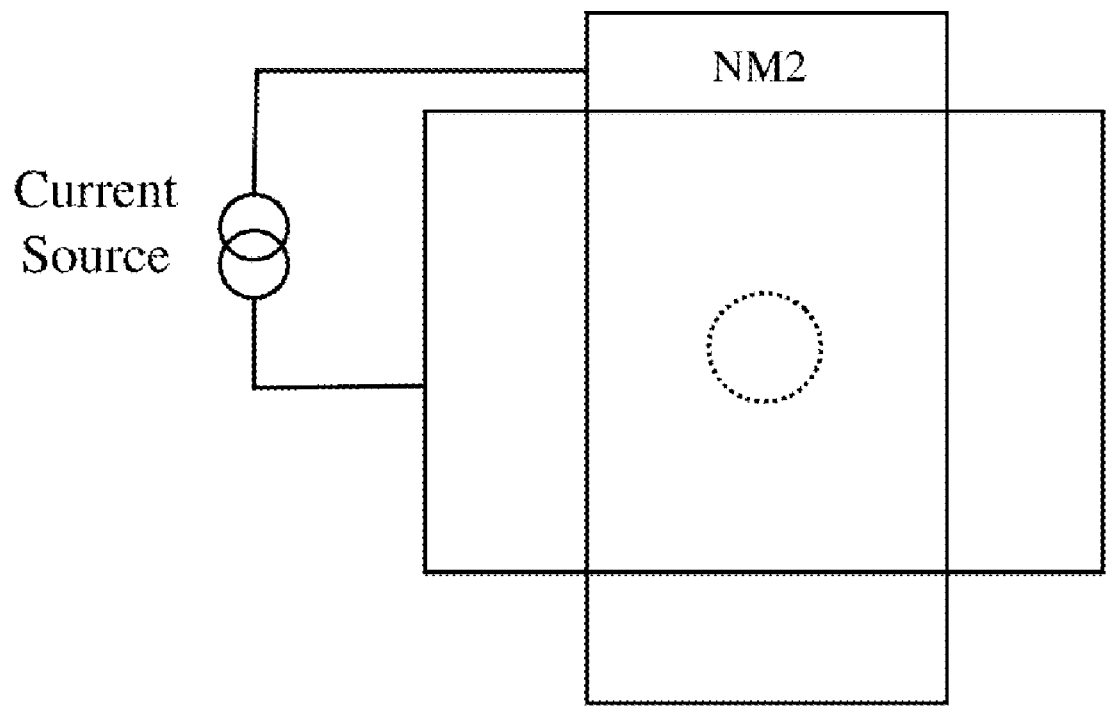

A microwave oscillator may include a nanopillar (FIG. 1) or a nanocontact to a single extended magnetic thin film (FIGS. 4a-b). A nanocontact refers to a contact that is less than about a few hundred nm in lateral size. There may be advantages to having an array of nanocontacts that interact with one another (FIGS. 5, 6). This may increase the output power of the oscillator. Additionally, an array of oscillators that oscillate in phase at the same frequency (or multiples of the same frequency) are known as phase locked oscillators. Phase locking occurs when there is an interaction or coupling between oscillators. In the case of these oscillators, the coupling may be through spin-waves in a magnetic film. The interaction may also be through the changing magnetic fields one oscillator produces at the location of the other oscillators. The coupling may also be electrical if the oscillators are electrically connected in parallel or series, thus as this also leads to phase locking. Furthermore, it has already been demonstrated in experiments that spin-transfer oscillators that include two magnetic thin films interact through spin-waves in the magnetic films. The resulting oscillator according to the present invention has a power that varies periodically as a function of time in response to a dc input current.

Figure 7:
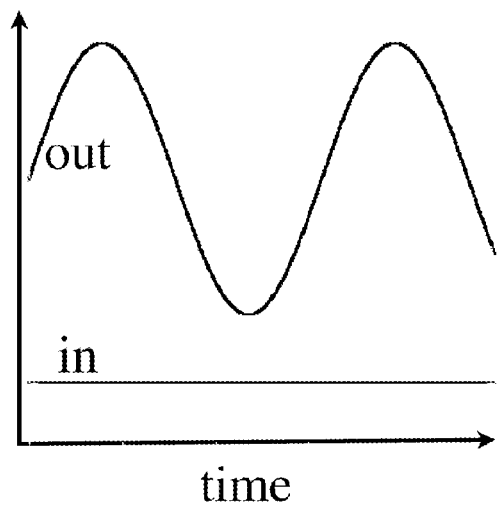
FIG. 7 is a graph illustrating the input and output signal for an oscillator as a function of time for an embodiment of the present invention.

An oscillator array may be configured in a number of ways. There may be periodic arrays of nanocontacts, where each contact is separated by a fixed distance. The array may be two-dimensional (FIG. 7) or may have a single row of nanocontacts in one-dimension. The contacts may be wired electrically to be in parallel or series. Each nanocontact may also have its own independent contacts for an independent current source, permitting independent control of the oscillator. An applied magnetic field may also be used to control the oscillation frequency and power.

The single layer device of the present invention takes advantage of the quality of a single layer as an oscillator in the microwave frequency range. In contrast to the devices with two magnetic layers, all of the excitations of a single layer are non-uniform. Furthermore, the currents necessary to operate such a device can be reduced significantly, if it exhibits an intrinsic non-uniformity in its magnetization to start with.

A preferred implementation of a single magnetic layer nanopillar or nanocontact device as an oscillator is as follows. First, the device may be operated within a range of magnetic fields for which there are reversible changes in device resistance (as opposed to hysteretic switching). Note that this may occur in the absence of an applied field (in zero applied field). Devices that exhibit reversible changes in device resistance in the absence of an applied magnetic field would be desirable for applications as oscillators. Second, a dc current is applied to the device that exceeds the threshold for magnetic excitations. There will then be a high frequency or rf voltage developed across the device. The rf voltage between the bottom and top contacts of the device is the oscillating output voltage, and hence power.

The rf frequency will depend on the current, magnetic field, device materials, device shape and the device type; a nanopillar or nanocontact device. For both nanopillar and nanocontact devices, larger applied magnetic fields may lead to higher output frequency. The magnetic anisotropy, magnetization density and magnetic exchange interactions of the magnetic layer will affect the rf frequency. The frequency of the magnetization oscillations may be higher for materials with large exchange interactions or magnetization density. Also, increasing the magnetic anisotropy increases the frequency of the oscillations. In nanopillar devices, reducing the size of the pillar increases the frequency of the output signal. In either device both the current and applied magnetic field may be used to vary the rf frequency and the amplitude of the output signal.

The signal from a single nanopillar or nanocontact may be too small for many applications. Therefore, an array of nanopillars or nanocontacts may be coupled together. These oscillators would oscillate in phase in particular ranges of applied current and applied magnetic field. The oscillators could be wired to a common current source and thus coupled together electrically. The coupling in nanocontact devices could be through spin-waves in the magnetic film or magnetic dipole interactions between the contacts (i.e., magnetic fields that one contact experiences from another contact.) For a device array, the current could be independently controlled in each element of the array. Then the current within each device could be adjusted so that the oscillators oscillate in phase. The output again would consist of the voltage across the oscillator array. In nanopillars either the parallel or series combination of the device voltages could serve as the output signal, depending on the application. If large voltages are desired, the nanopillars would be wired in series. If larger output currents are desired the nanopillars would be wired together in parallel. Nanocontacts to the same magnetic film are naturally wired together in parallel.

Figure 8:
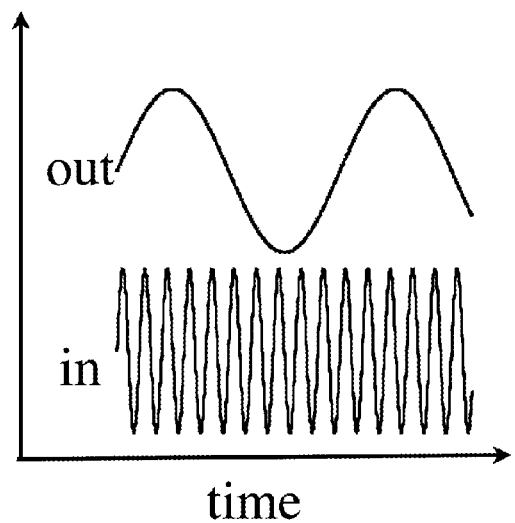
FIG. 8 is a graph illustrating the input and output signal for a mixer in accordance with an embodiment of the present invention.

In a mixer application, an rf signal input may be combined with a dc current that flows through the single layer device. If the frequency of the rf current is close to the frequency of single layer excitations then the rf current will lead to oscillations in the device resistance. The output signal will be a product of the rf current and rf changes in device resistance. The result will be a 'mixed' signal at the sum and difference frequencies of these oscillations. The signal of interest in devices that function as mixers is the low frequency signal (FIG. 8). The high frequency signal is easily removed with a low pass filter. As a specific example, if the rf signal frequency is the same as the frequency of magnetic excitations the result will be a dc signal and a signal at twice the input frequency. The signal of interest is the dc signal. One useful function of the mixer has been to reduce a high frequency signal to a low frequency one for further processing. For example, the high frequency may be a carrier signal for a communication device, such as a mobile phone. Further, a dc current may be added to the input signal to change the mixing frequency (the frequency of the device resistance oscillations) or to control the mixer characteristics. Generally, dc current of one polarity (the polarity of the current that would, if the current was sufficiently large, lead to magnetic excitations) will improve the quality factor of the resistance oscillations and the function of the mixer. It should be noted that the mixer may include a nanopillar, array of nanopillars, a nanocontact or an array of nanocontacts.

Figure 9:
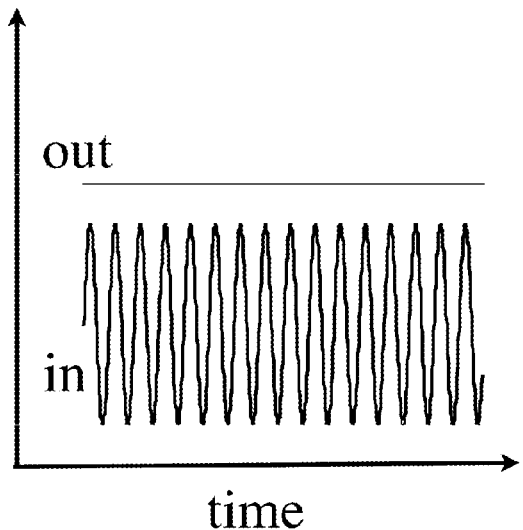
FIG. 9 is a graph illustrating the input and output signals for a detector in accordance with an embodiment of the present invention.

The mixer described above may also function as a detector of rf frequency. For instance, the single layer excitation frequency may be tuned to the desired detector frequency. An input at this frequency would lead to a dc voltage across the device (FIG. 9). A signal with a sufficiently different frequency would not lead to a dc voltage and therefore would not be detected. The ability to distinguish signals that are close in frequency may be a desirable characteristic. A dc current may be used to improve this function, or if broader band detection is desirable a dc current of the opposite polarity will increase the detection bandwidth. A current controlled bandwidth for single layer device is therefore possible.

The following references are incorporated by reference herein in their entirety:

J. Slonczewski, J. Magn. Magn. Mater. 159, L1 (1996);
L. Berger, Phys. Rev. B 54, 9353 (1996);
M. Tsoi et al., Phys. Rev. Lett. 80, 4281 (1998);
J. Z. Sun, J. Magn. Magn. Mater. 202, 157 (1999);
N. C. Emley et al., Appl. Phys. Lett., 84, 4257 (2004);
J. A. Katine et al., Phys. Rev. Lett. 84, 3149 (2000);
J. Grollier et al., Appl. Phys. Lett. 78, 3663 (2001);
J.-E. Wegrowe et al., Europhys. Lett. 45, 626 (1999);
S. Urazhdin et al., Phys. Rev. Lett. 91, 146803 (2003);
G. Fuchs et al et al., Appl. Phys. Lett., 85, 1205 (2004);
B. Özyilmaz et al., Phys. Rev. Lett. 91, 067203 (2003);
M. Covington et al., Phys. Rev. B 69, 184406 (2004);
M. Yamanouchi et al., Nature 428, 539-542 (2004);
I. N. Krivorotov et al., Science 307, 228 (2005);
S. I. Kiselev et al., Nature, 425, 380 (2003);
W. H. Rippard et al., Phys. Rev. Lett. 92, 027201 (2004);
Y. Ji, C. L. Chien and M. D. Stiles, Phys. Rev. Lett. 90, 106601 (2003);
B. Özyilmaz et al., Phys. Rev. Lett. 93, 176604 (2004);
M. L. Polianski and P. W. Brouwer, Phys. Rev. Lett. 92, 26602 (2004);
M. D. Stiles, J. Xiao and A. Zangwill, Phys. Rev. B 69, 054408 (2004);
B. Özyilmaz et al., Phys. Rev. B 71, 140403 (R) (2005);
A. Brataas, Y. Tserkovnyak and G. E. W. Bauer, cond-mat/ 0501672 (2005);
Kyung-Jin Lee et al., Nature Materials 3, 877-881 (2004);
B. Özyilmaz, Ph.D. Thesis, New York University (2005);
S. Adam, M. L. Polianski and P. W. Brouwer, cond-mat/ 0508732 (2005);
J. Slonczewski, Journal of Magnetism and Magnetic Materials 159, L1 (1996);
U.S. Pat. No. 5,695,864;
T. Y. Chen et al. PRL 96, 207203 (2006);
S. I. Kiselev et al., Physical Review B 72, 064430 (2005);
V. S. Pribiag et al., Nature Physics 3, 498 (2007);
S. Kaka et al., Nature (London), 437, 393 (2005);
F. B. Mancoff et al., Nature (London) 437, 389 (2005);
M. R. Pufall, et al., Phys. Rev. Lett. 97, 087206 (2006);
B. Ozyilmaz, et al., Applied Physics Letters 88, 162506 (2006)

The present invention is not to be limited in scope by the specific embodiments described herein. Indeed, various modifications of the invention in addition to those described herein will become apparent to those skilled in the art from the foregoing description and the accompanying figures. Such modifications are intended to fall within the scope of the claims.

What is claimed is:

1. A magnetic device capable of current induced single layer magnetic configuration switching, comprising:
a nanopillar structure having a single magnetic layer including a nonuniform magnetization material which when traversed by a spin polarized current of a first polarity exhibits a second electrical resistance value which is different from a first electrical resistance value exhibited by said magnetic layer prior to being traversed by said current, wherein a change between said first electrical resistance value and an associated magnetization configuration and said second electrical resistance value with an associated switched second magnetization configuration exhibits hysteretic characteristics.

2. The magnetic device of claim 1, wherein said magnetic layer is positioned asymmetrically within said nanopillar structure.

3. The magnetic device of claim 1, wherein said nonuniform magnetization material is formed using a preselected shape which imparts a nonuniform magnetization.

4. The magnetic device of claim 1, wherein said nonuniform magnetization material includes a magnetization layer grown over a roughened portion.

5. The magnetic device of claim 1, wherein said nonuniform magnetization material includes a roughened portion formed lithographically.

6. The magnetic device of claim 1, wherein said nonuniform magnetization material includes a granular solid.

7. The magnetic device of claim 6, wherein the granular solid includes a magnetic material and a non-magnetic material.

8. The magnetic device of claim 7, wherein the magnetic material includes a transition metal selected from the group consisting of Ni, Fe, Co and alloys thereof, and the non-magnetic material is selected from the group consisting of Au, Ag, Cu, Cr, Rh and alloys thereof.

9. The magnetic device of claim 1, wherein said nanopillar comprises a layer of Pt, followed by a first layer of Cu, followed by a layer of Co, followed by a second layer of Cu.

10. The magnetic device of claim 1, wherein said magnetic material is selected from the group consisting of $Fe_3O_4$, $CrO_2$, Manganite materials including $LaCaMnO_3$, $La_{1-x}Ca_xMnO_3$, $La_{0.7}Ca_{0.3}MnO_3$, LSMO materials including $La_{1-x}Sr_xMnO_3$, $La_{0.7}Sr_{0.3}MnO_3$ and Heusler alloys.

11. The magnetic device of claim 1, wherein said magnetic material includes one of a low magnetization density ferromagnetic material and a dilute ferromagnetic semiconductor, wherein the low magnetization density ferromagnetic material is selected from the group consisting of Co, Ni, Fe alloyed with Ti, V, Cr, Mn or Cu.

12. A magnetic memory device capable of current induced single layer magnetic configuration switching, comprising:
a nanopillar structure having a single magnetic layer including a nonuniform magnetization material of a first magnetization configuration which when traversed by a spin polarized current of a first polarity changes to a second magnetization configuration and exhibits a second electrical resistance value which is different from a first electrical resistance value exhibited by said magnetic layer prior to being traversed by said current, wherein the presence of one of said first electrical resistance value and said second electrical resistance value indicates an information element stored in said magnetic memory device, and wherein a change between said first electrical resistance value and said second electrical resistance value exhibits hysteretic characteristics.

13. The magnetic memory device of claim 12 wherein said magnetic layer is positioned asymmetrically within said nanopillar structure.

14. The magnetic memory device of claim 12, wherein said nonuniform magnetization material includes a magnetization layer grown over a roughened portion.

15. The magnetic memory device of claim 12, wherein said nonuniform magnetization material includes one of a roughened portion formed lithographically and a granular solid.

16. The magnetic memory device of claim 12, wherein said nanopillar comprises a layer of Pt, followed by a first layer of Cu, followed by a layer of Co, followed by a second layer of Cu.

17. The magnetic memory device of claim 12, wherein said magnetic material is selected from the group consisting of $Fe_3O_4$, $CrO_2$, Manganite materials including $LaCaMnO_3$, $La_{1-x}Ca_xMnO_3$, $La_{0.7}Ca_{0.3}MnO_3$, LSMO materials including $La_{1-x}Sr_xMnO_3$, $La_{0.7}Sr_{0.3}MnO_3$ and Heusler alloys.

18. The magnetic memory device of claim 12, wherein said magnetic material includes one of a low magnetization density ferromagnet and a dilute ferromagnetic semiconductor.

19. A magnetic material oscillator, comprising:
a single magnetic layer including a nonuniform magnetization material which when traversed by a spin polarized current of a predetermined current density range thereby results in a reorientation of the magnetic moments of the magnetic layer which takes place in a substantially oscillatory manner such that an electrical resistance value characteristic of said magnetic layer oscillates in a substantially regular manner.

20. The magnetic material oscillator of claim 19, further comprising an array of nanocontacts arranged to provide contact with said magnetic layer, wherein said array of contacts is one of a one-dimensional array and a two-dimensional array.

21. The magnetic material oscillator of claim 19, wherein said nonuniform magnetization material is selected from the group consisting of $Fe_3O_4$, $CrO_2$, Manganite materials including $LaCaMnO_3$, $La_{1-x}Ca_xMnO_3$, $La_{0.7}Ca_{0.3}MnO_3$, LSMO materials including $La_{1-x}Sr_xMnO_3$, $La_{0.7}Sr_{0.3}MnO_3$ and Heusler alloys, and wherein said magnetic material optionally includes one of a low magnetization density ferromagnet and a dilute ferromagnetic semiconductor.

22. The magnetic material oscillator of claim 19, wherein said predetermined current density range ranges from $10^5$ $A/cm^2$ to $10^8$ $A/cm^2$.

23. A magnetic material frequency mixer, comprising:
a single magnetic layer including a nonuniform magnetization material which when traversed by an oscillating spin polarized current of a predetermined current density range results in a reorientation of the magnetic moments of the magnetic layer which thereby takes place in a substantially oscillatory manner such that an electrical resistance value characteristic of said magnetic layer oscillates in a substantially regular manner, such that when a frequency of the oscillating spin polarized current is substantially equivalent to a frequency of the magnetic layer oscillation, an oscillating voltage will be developed by the magnetic layer, the oscillating voltage having a frequency which is the difference of the frequency of the oscillating spin polarized current and the frequency of the magnetic layer oscillation.

24. The magnetic material frequency mixer of claim 23, wherein the difference signal is a dc signal.

25. The magnetic material frequency mixer of claim 23, further comprising an input for receiving a dc current which is used to modify the frequency of the magnetic layer oscillation.

* * * * *